(12) United States Patent
Shirai et al.

(10) Patent No.: US 9,486,953 B2
(45) Date of Patent: Nov. 8, 2016

(54) IMPRINT APPARATUS AND IMPRINT METHOD

(71) Applicant: FUJITSU LIMITED, Kawasaki-shi, Kanagawa (JP)

(72) Inventors: Katsuki Shirai, Yokohama (JP); Chikara Nishio, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 624 days.

(21) Appl. No.: 13/960,984

(22) Filed: Aug. 7, 2013

(65) Prior Publication Data

US 2014/0110883 A1    Apr. 24, 2014

(30) Foreign Application Priority Data

Oct. 18, 2012  (JP) ................. 2012-231135

(51) Int. Cl.
| | |
|---|---|
| B29C 59/02 | (2006.01) |
| G03F 7/00 | (2006.01) |
| G03F 7/20 | (2006.01) |
| G03F 7/16 | (2006.01) |

(52) U.S. Cl.
CPC .......... B29C 59/026 (2013.01); G03F 7/0002 (2013.01); *B29C 59/022* (2013.01); *B29C 2059/023* (2013.01); *G03F 7/161* (2013.01); *G03F 7/70808* (2013.01); *G03F 7/70908* (2013.01); *G03F 7/70916* (2013.01)

(58) Field of Classification Search
CPC .............. B29C 59/022; B29C 59/026; B29C 2059/023; G03F 7/0002; G03F 7/161; G03F 7/70808; G03F 7/70908; G03F 7/70916

USPC .......................................... 264/293; 425/385
See application file for complete search history.

(56) References Cited

U.S. PATENT DOCUMENTS 6,482,742 B1    11/2002  Chou
2006/0150849 A1*  7/2006  Van Santen .............. B41C 1/10
                                            101/483

FOREIGN PATENT DOCUMENTS

| JP | 08-245225 A | 9/1996 |
|---|---|---|
| JP | 2004-504718 A | 2/2004 |
| JP | 2005-091915 | 4/2005 |

OTHER PUBLICATIONS

Japanese Office Action Notification of Reasons for Refusal application No. 2012-231135 dated Jan. 26, 2016.

* cited by examiner

*Primary Examiner* — Joseph S. Del Sole
*Assistant Examiner* — Lawrence D Hohenbrink, Jr.
(74) *Attorney, Agent, or Firm* — Squire Patton Boggs (US) LLP

(57) ABSTRACT

An imprint apparatus includes: a mold that forms a pattern in a resin on a base plate; a press unit that presses the mold against the resin; a flow channel that is formed by a wall of the mold and a surface of the resin, air flowing along the wall and the surface; a supply unit that supplies air to the flow channel; wherein the supply unit supplies air with a first pressure to the flow channel when the mold makes contact with the resin.

6 Claims, 16 Drawing Sheets

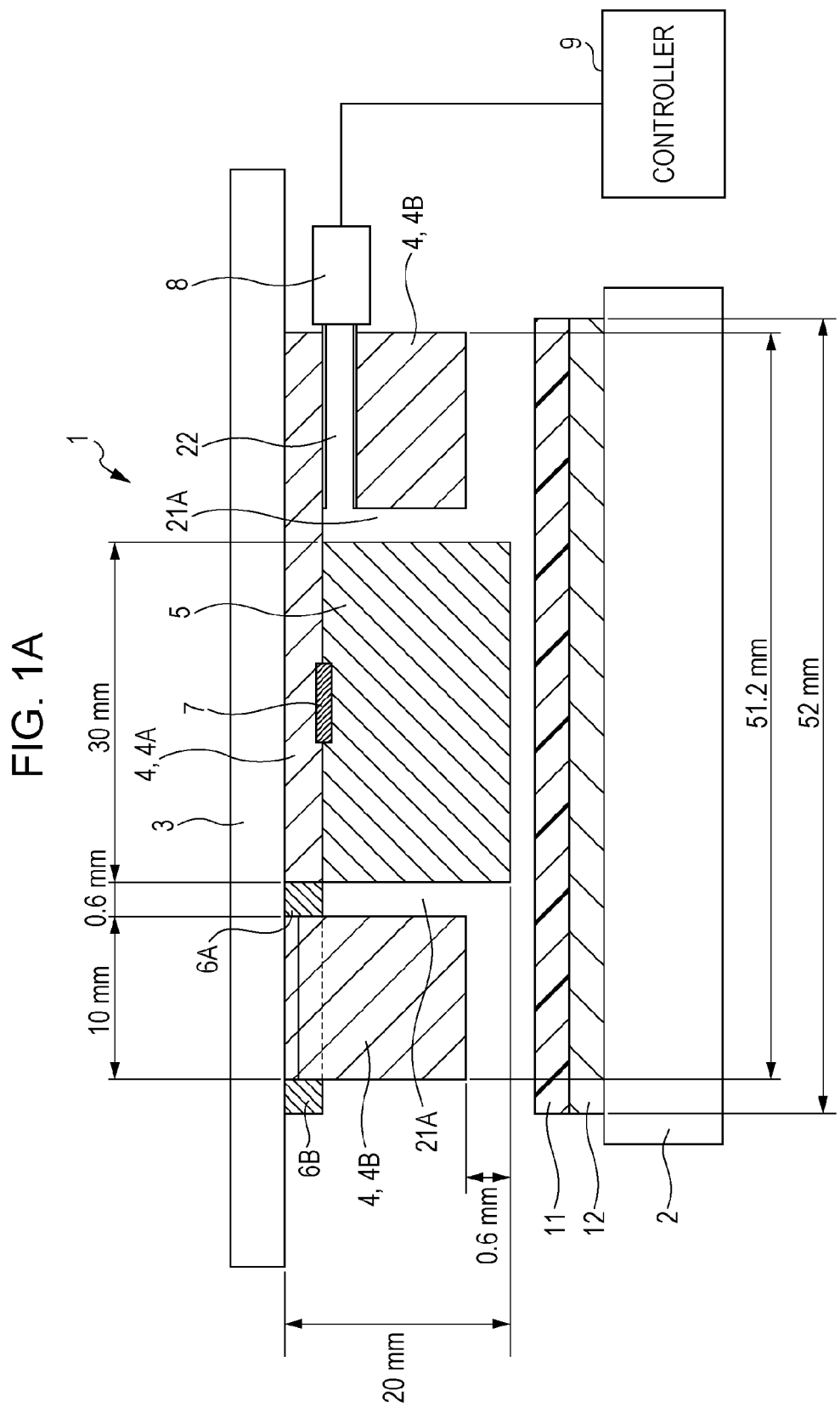

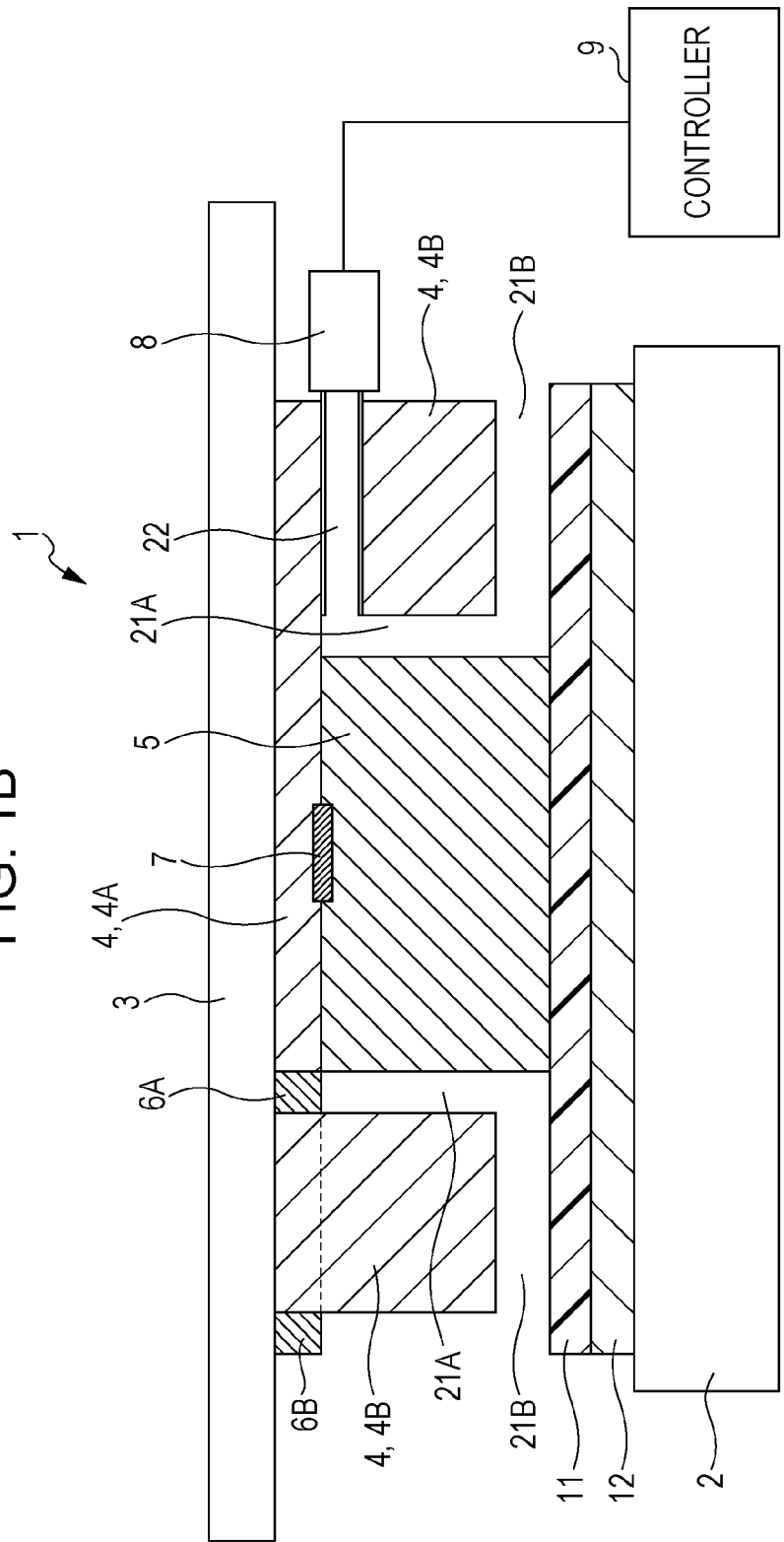

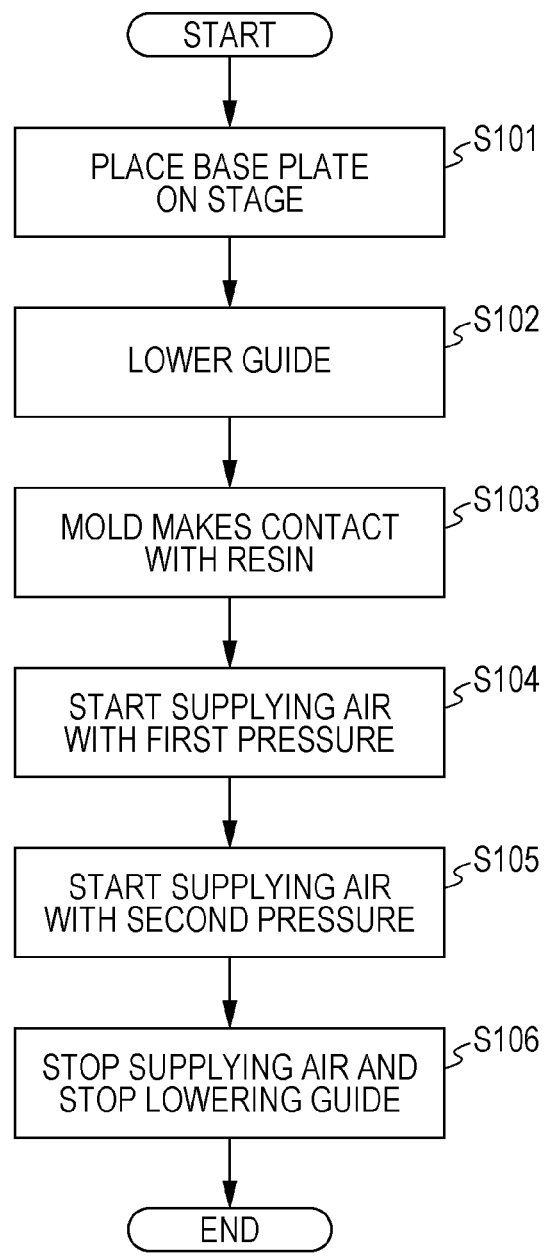

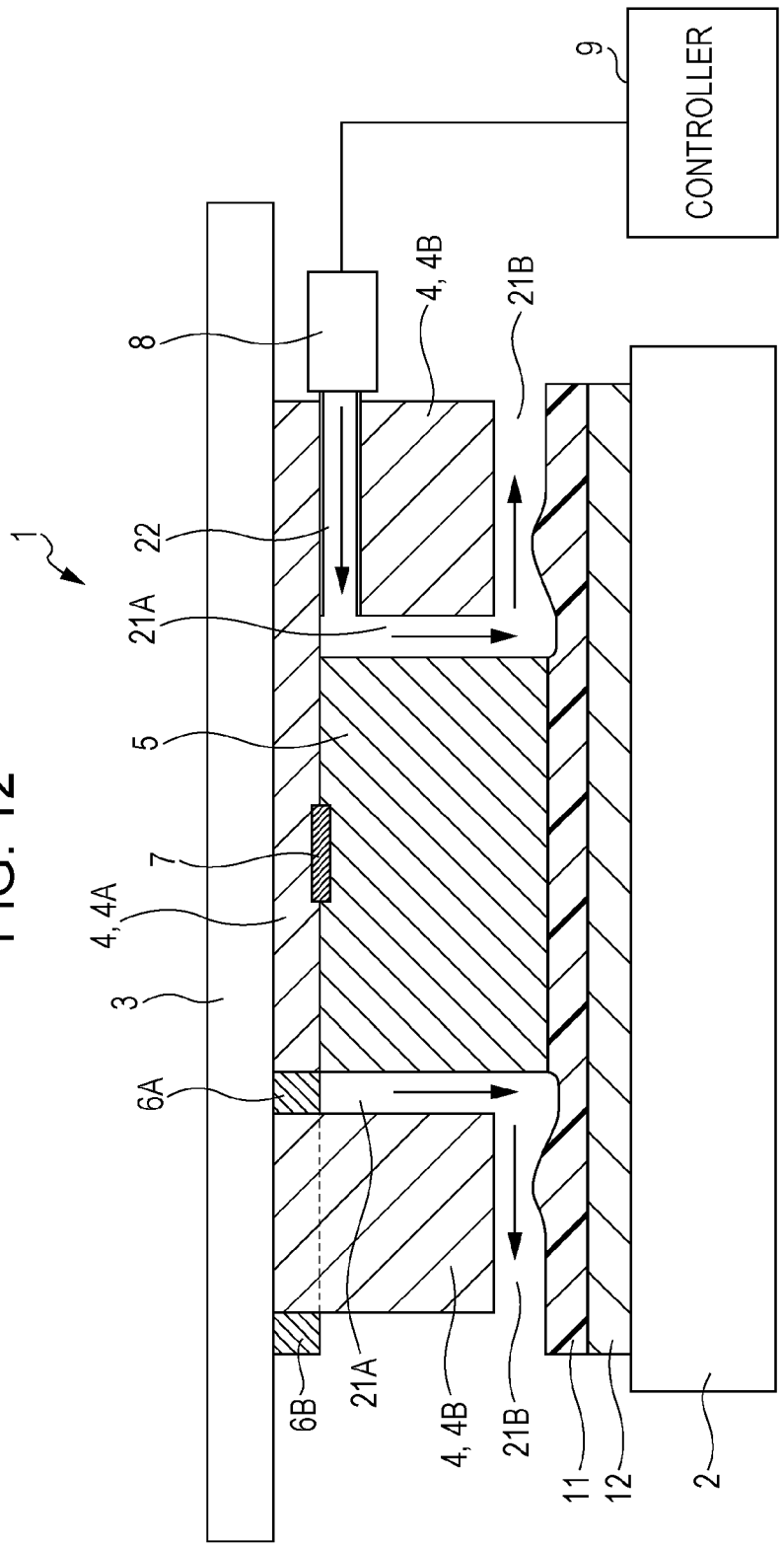

PENETRATION OF SOLVENT

IMPRINT APPARATUS AND IMPRINT METHOD

CROSS-REFERENCE TO RELATED APPLICATION

This application is based upon and claims the benefit of priority of the prior Japanese Patent Application No. 2012-231135, filed on Oct. 18, 2012, the entire contents of which are incorporated herein by reference.

FIELD

The embodiment discussed herein is related to an imprint apparatus and an imprint method.

BACKGROUND

An imprint method, which is one of microfabrication techniques, forms a desired pattern in a resin applied to a base plate by pressing a mold against the resin. After the pattern formed in the resin is coated with metal such as copper, the metal is flattened by grinding to form wiring on the base plate.

FIG. 13 depicts a process of forming wiring on the base plate. As depicted in FIG. 13A, a resin 52 is applied to a base plate 51. Next, as depicted in FIG. 13B, a mold 53 is pressed against the resin 52 to form a pattern in the resin 52. Next, as depicted in FIG. 13C, the remaining film of the resin 52 is removed by anisotropic etching. Next, as depicted in FIG. 13D, the pattern formed in the resin 52 is coated with copper 54. Next, as depicted in FIG. 13E, the copper 54 is flattened by grinding to form wiring 55 on the base plate 51. In addition, a plurality of layers of wiring 55 are formed on the base plate 51 by repeating the process depicted in FIGS. 13A to 13E.

Japanese Laid-open Patent Publication No. 08-245225 and Japanese National Publication of International Patent Application No. 2004-504718 are examples of related art.

When the mold 53 makes contact with the resin 52 in a process of forming a pattern in the resin 52, the resin 52 climbs the wall of the mold 53 due to capillary phenomenon. When the mold 53 is pressed against the resin 52, the resin 52 is extruded by the mold 53 and a protrusion of the resin 52 is formed around the mold 53, as depicted in FIG. 14. If there is a climbing section of the resin 52 on the wall of the mold 53, the climbing section of the resin 52 is stripped in a process of flattening metal and the pattern surface of the resin 52 is damaged by the stripped resin 52.

There are methods of removing the protrusion of the resin 52: a method of scraping the resin 52 with a squeegee, a method of decomposing the resin 52 with plasma, and a method of dissolving the resin 52 with a solvent. When the protrusion of the resin 52 is removed by scraping the protrusion with a squeegee 56, a resin layer 57, formed on the wall of the mold 53, is not removed and left as a sharp protrusion, as depicted in FIG. 15. In this case, the resin layer 57 is stripped in a process of flattening metal and the stripped resin layer 57 damages the pattern surface of the resin 52, thereby degrading the product quality. An additional process of removing the stripped resin layer 57 that avoids the pattern surface of the resin 52 from being damaged by the stripped resin layer 57 increases cost.

When the protrusion of the resin 52 is removed by decomposing the resin 52 with plasma, high energy of plasma damages the base board 51 and the mold 53, thereby degrading the product quality. When the protrusion of the resin 52 is removed by dissolving the resin 52 with a solvent 58, the solvent 58 penetrates the resin 52 in which a pattern has been formed as depicted in FIG. 16, thereby degrading the product quality. In addition, an additional rinse process of removing the solvent 58 increases cost.

There is a method of suppressing the generation of a protrusion of the resin 52. In this method, the mold 53 larger than the base plate 51 is pressed against the resin 52 as depicted in FIG. 17A. As depicted in FIG. 17B, bubbles 59 are caught in a concavo-convex pattern of the mold 53 when the mold 53 is pressed against the resin 52. As depicted in FIG. 17C, when the mold 53 is further pressed against the resin 52, the bubbles 59 move toward the outside of the mold 53. As depicted in FIG. 17D, as the gap between the mold 53 and the base plate 51 becomes smaller, the flow resistance of the resin 52 increases and the bubbles 59 between the concavo-convex pattern of the mold 53 and the resin 52 are hard to release, thereby degrading the quality of the pattern formed in the resin 52.

The purpose of this disclosure is to provide a technology for avoiding a resin from climbing the wall of a mold and removing the protrusion of the resin.

SUMMARY

According to an aspect of the invention, An imprint apparatus includes: a mold that forms a pattern in a resin on a base plate; a press unit that presses the mold against the resin; a flow channel that is formed by a wall of the mold and a surface of the resin, air flowing along the wall and the surface; a supply unit that supplies air to the flow channel; wherein the supply unit supplies air with a first pressure to the flow channel when the mold makes contact with the resin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a schematic diagram depicting an imprint apparatus 1 according to example 1;

FIG. 1B is a schematic diagram depicting the imprint apparatus 1 according to example 1;

FIG. 2 depicts a processing flow of an imprint method according to example 1;

FIG. 12 is a schematic diagram depicting the imprint apparatus when air with the first pressure is supplied to the flow channel;

DESCRIPTION OF EMBODIMENT

Figure 3:
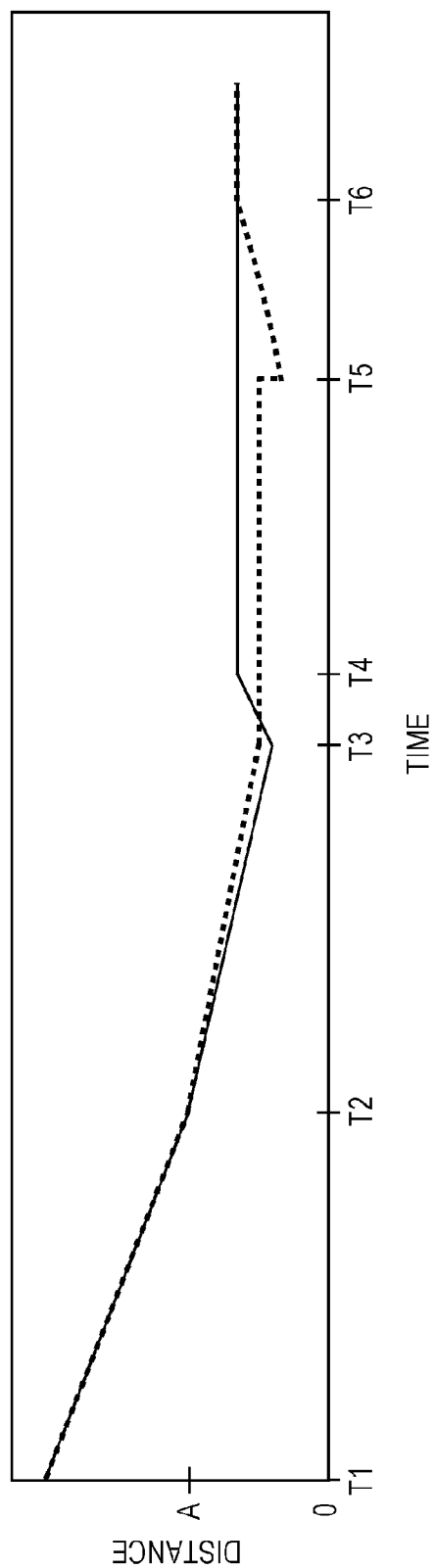
FIG. 3 is a graph depicting changes in the distance from a displacement sensor to a resin and changes in the distance from another displacement sensor to the resin.

Imprint apparatuses and imprint methods according to an embodiment will be described with reference to the drawings. The structures of the following examples are only examples and do not restrict an imprint apparatus and an imprint method according to the present embodiment.

Example 1

An imprint apparatus 1 and an imprint method according to example 1 will be described. FIGS. 1A and 1B are schematic diagrams depicting the imprint apparatus 1 according to example 1. As depicted in FIG. 1A, the imprint apparatus 1 includes a stage 2, a lift 3, a guide 4, a mold (press mold) 5, displacement sensors 6A and 6B, a pressure sensor 7, a supply unit 8, and a controller 9.

A base plate 12 on which a resin 11 has been put (formed) is placed on the stage 2. The resin 11 is thermosetting resin, thermoplastic resin, photocurable resin, or so on. The base plate 12 is also called a supporting plate. The base plate 12 is a printed circuit board or a semiconductor substrate, for example.

The lift 3 is disposed on the guide 4 to lift the guide 4. The mold 5, the displacement sensors 6A and 6B, the pressure sensor 7, and the supply unit 8 are mounted on the guide 4. If the guide 4 moves up, then the mold 5, the displacement sensors 6A and 6B, the pressure sensor 7, and the supply unit 8 are raised. The lift 3 lowers the guide 4. If the guide 4 moves down, then the mold 5, the displacement sensors 6A and 6B, the pressure sensor 7, and the supply unit 8 are lowered. The driving of the lift 3 is controlled by the controller 9.

The controller 9 includes a central processing unit (CPU) and a main memory unit. The CPU is also called a processor. The CPU executes a computer program loaded in an executable manner in the main memory unit. The main memory unit is also called a memory. The main memory unit stores computer programs executed by the CPU, data processed by the CPU, and so on. The main memory unit is a volatile random access memory (RAM) or a non-volatile read-only memory (ROM), for example. The main memory unit may include a RAM and a ROM. The controller 9 may be a personal computer.

The guide 4 has a concave shape, the mold 5 is disposed on a bottom 4A of the guide 4, and a space functioning as a flow channel 21A is disposed between sides 4B of the guide 4 and the mold 5. The flow channel 21A is disposed along a wall of the mold 5 so as to surround the mold 5.

A supply channel 22 through which air is supplied from the supply unit 8 to the flow channel 21A is disposed in the side 4B of the guide 4. The flow channel 21A is connected to one end of the supply channel 22 and the supply unit 8 is connected to the other end. The supply unit 8 supplies air to the flow channel 21A through the supply channel 22. The supply unit 8 is an air compressor, for example. The driving of the supply unit 8 is controlled by the controller 9. FIG. 1A depicts the dimensions of the imprint apparatus 1 as examples, but the present embodiment is not restricted by these dimensions.

The supply unit 8 supplies air to the flow channel 21A through the supply channel 22, so that air flows through the flow channel 21A along the wall of the mold 5. The flow channel 21A is desirably disposed so that the space between the sides 4B of the guide 4 and the mold 5 is sufficient enough to block a pressure gradient from generating in air flowing through the flow channel 21A.

As depicted in FIG. 1B, if the guide 4 is lowered until the mold 5 makes contact with the resin 11, a space functioning as a flow channel 21B is formed between the sides 4B of the guide 4 and the resin 11. Air flows through the flow channel 21A along the wall of the mold 5, flows through the flow channel 21B along the surface of the resin 11, and is discharged outside the guide 4.

A concavo-convex pattern is present on a lower surface (surface in contact with the resin 11) of the mold 5 has lower surface. When the lift 3 lowers the guide 4 and presses the mold 5 against the resin 11 on the base plate 12, a concavo-convex pattern (referred to below as a pattern) is formed on the resin 11. The lift 3 is an example of a press unit. After the pattern is formed on the resin 11 and the resin 11 is hardened, the guide 4 is raised to strip the mold 5 from the resin 11.

The displacement sensors 6A and 6B are disposed in the guide 4. The displacement sensor 6A is placed in a position, inside the side 4B of the guide 4, in the vicinity of the mold 5. The displacement sensor 6A is disposed in the guide 4 so as to be vertically aligned with the flow channel 21A. The displacement sensor 6B is placed outside the side 4B of the guide 4.

The displacement sensors 6A and 6B are optical (two-dimensional triangular distance) displacement sensors, for example. The displacement sensors 6A and 6B have a light emitting element and a light receiving element. Light exiting from the light emitting element enters the resin 11 and the reflected light enters the light receiving element. The position at which the reflected light enters the light receiving element depends on the distance between the displacement sensors 6A and 6B and the resin 11. The displacement sensors 6A and 6B outputs the position at which the reflected light enters the light receiving element, as the amount of displacement. The controller 9 calculates the distance from the displacement sensor 6A to the resin 11 based on the output value of the displacement sensor 6A. The controller 9 calculates the distance from the displacement sensor 6B to the resin 11 based on the output value of the displacement sensor 6B.

The controller 9 detects that the distance from the displacement sensor 6A to the resin 11 is equal to or less than predetermined distance A. Predetermined distance A is stored in the main memory unit included in the controller 9.

Predetermined distance A is equal to, for example, the height of the mold 5. Accordingly, when the mold 5 lowers and makes contact with the resin 11, the distance from the displacement sensor 6A to the resin 11 is equal to or less than predetermined distance A.

The controller 9 detects that the mold 5 has made contact with the resin 11 by finding the distance from the displacement sensor 6A to the resin 11 to be equal to or less than predetermined distance A. When the mold 5 makes contact with the resin 11, the controller 9 controls the driving of the supply unit 8 and the supply unit 8 supplies air with the first pressure (Pa) to the flow channel 21A through the supply channel 22.

When the mold 5 makes contact with the resin 11, the resin 11 climbs the wall of the mold 5 due to capillary phenomenon. If air with the first pressure is supplied to the flow channel 21A and the air with the first pressure rises along the wall of the mold 5, then a rise of the resin 11 along the wall of the mold 5 is suppressed.

The pressure sensor 7 is disposed between the bottom 4A of the guide 4 and the mold 5. The pressure sensor 7 measures the pressure applied to the resin 11 when the resin 11 is pressed by the mold 5. The controller 9 reads the measurement value of the pressure sensor 7. The controller 9 compares the measurement value of the pressure sensor 7 with predetermined value B to determine whether the measurement value of the pressure sensor 7 is equal to or more than predetermined value B. Predetermined value B is stored in the main memory unit included in the controller 9. Predetermined value B depends on the type, thickness, temperature condition, or so on of the resin 11, and may be calculated through an experiment or simulation.

When the measurement value of the pressure sensor 7 is equal to or more than predetermined value B, the controller 9 controls the driving of the supply unit 8 and the supply unit 8 supplies air with the second pressure (Pa) to the flow channel 21A through the supply channel 22. The second pressure is higher than the first pressure. When air with the second pressure is supplied to the flow channel 21A and air with the second pressure flows through the flow channel 21A along the mold 5, a portion of the resin 11 in the vicinity of the mold 5 moves outside the base plate 12. When air with the second pressure flows through the flow channel 21B, a portion of the resin 11 surrounding the base plate 12 is removed.

The controller 9 compares the distance from the displacement sensor 6A to the resin 11 with the distance from the displacement sensor 6B to the resin 11 to determine whether they match each other.

If the distance from the displacement sensor 6A to the resin 11 matches the distance from the displacement sensor 6B to the resin 11, the controller 9 controls the driving of the controller 9 and the supply unit 8 stops the supply of air to the flow channel 21A. The controller 9 controls the driving of the lift 3 and the lift 3 raises the guide 4 to cause the mold 5 to be stripped from the resin 11.

Figure 4:
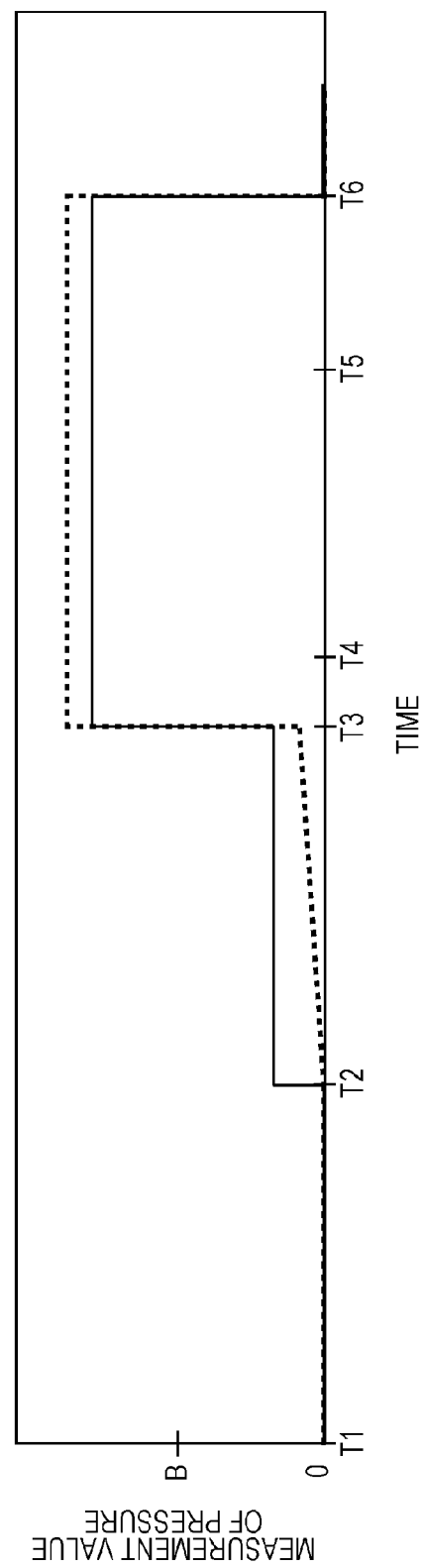
FIG. 4 is a graph depicting changes in the pressure (Pa) of air supplied by a supply unit and changes in the measurement value by a pressure sensor.

FIG. 2 depicts a processing flow of an imprint method according to example 1. FIG. 3 is a graph depicting changes in the distance from the displacement sensor 6A to the resin 11 and changes in the distance from the displacement sensor 6B to the resin 11. In FIG. 3, changes in the distance from the displacement sensor 6A to the resin 11 are indicated by a solid line and changes in the distance from the displacement sensor 6B to the resin 11 are indicated by a dashed line. FIG. 4 is a graph depicting changes in the pressure (Pa) of air supplied by the supply unit 8 and changes in the measurement value of the pressure sensor 7. In FIG. 4, changes in the pressure of air supplied by the supply unit 8 are indicated by a solid line and changes in the measurement value of the pressure sensor 7 are indicated by a dashed line.

Figure 5:
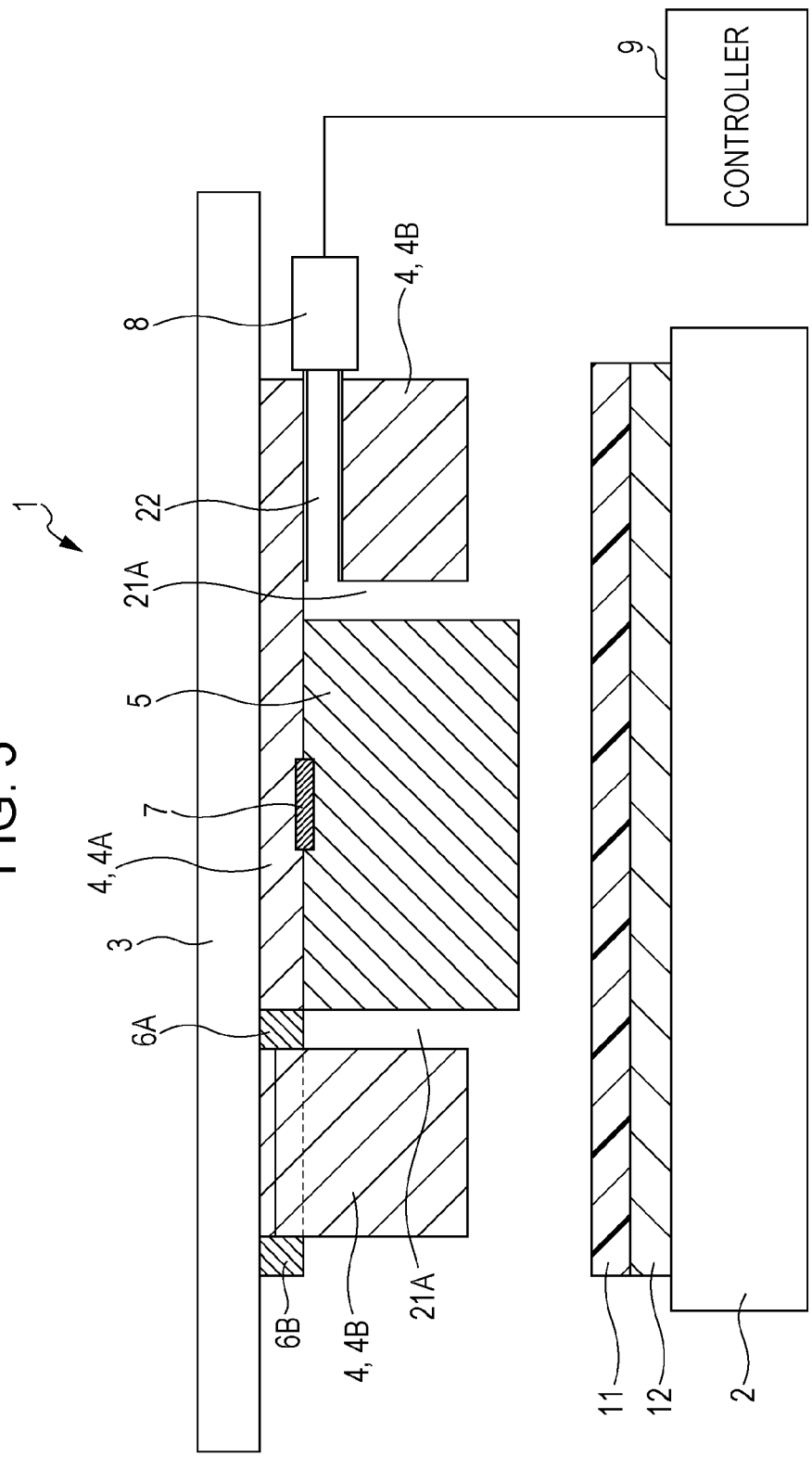
FIG. 5 is a schematic diagram depicting the imprint apparatus when a base plate is placed on a stage.

In the imprint method according to example 1, the base plate 12 on which the resin 11 has been put (formed) is first placed on the stage 2 and the mold 5 is placed above the base plate 12 (S101 in FIG. 2). FIG. 5 is a schematic diagram depicting the imprint apparatus 1 when the base plate 12 is placed on the stage 2.

Next, the lift 3 lowers the guide 4 at a predetermined speed (S102 in FIG. 2). The distances between the displacement sensors 6A and 6B and the resin 11 become smaller as the guide 4 lowers. Accordingly, the distance from the displacement sensor 6A to the resin 11 and the distance from the displacement sensor 6B to the resin 11 become gradually smaller in time T1 to T2 in FIG. 3. Since the supply unit 8 does not supply air yet, the pressure of air supplied by the supply unit 8 is 0 Pa in time T1 to T2 in FIG. 4.

When a predetermined time elapses after the guide 4 starts lowering, the mold 5 makes contact with the resin 11 (S103 in FIG. 2). When the mold 5 makes contact with the resin 11, the distance from the displacement sensor 6A to the resin 11 and the distance from the displacement sensor 6B to the resin 11 become predetermined distance A at time T2, as depicted in FIG. 3. The controller 9 detects that the mold 5 has made contact with the resin 11 by finding the distance from the displacement sensor 6A to the resin 11 to be equal to or less than predetermined distance A.

When the controller 9 detects that the mold 5 has made contact with the resin 11, the supply unit 8 starts supplying air with the first pressure to the flow channel 21A (S104 in FIG. 2). That is, when the mold 5 makes contact with the resin 11, the supply unit 8 supplies air with the first pressure to the flow channel 21A. The driving of the supply unit 8 is controlled by the controller 9. For example, as depicted in FIG. 4, air with the first pressure is supplied to the flow channel 21A at time T2. The first pressure is 0.1 MPa, for example. The first pressure may be set depending on the type, thickness, temperature conditions, and so on of the resin 11.

Figure 6:
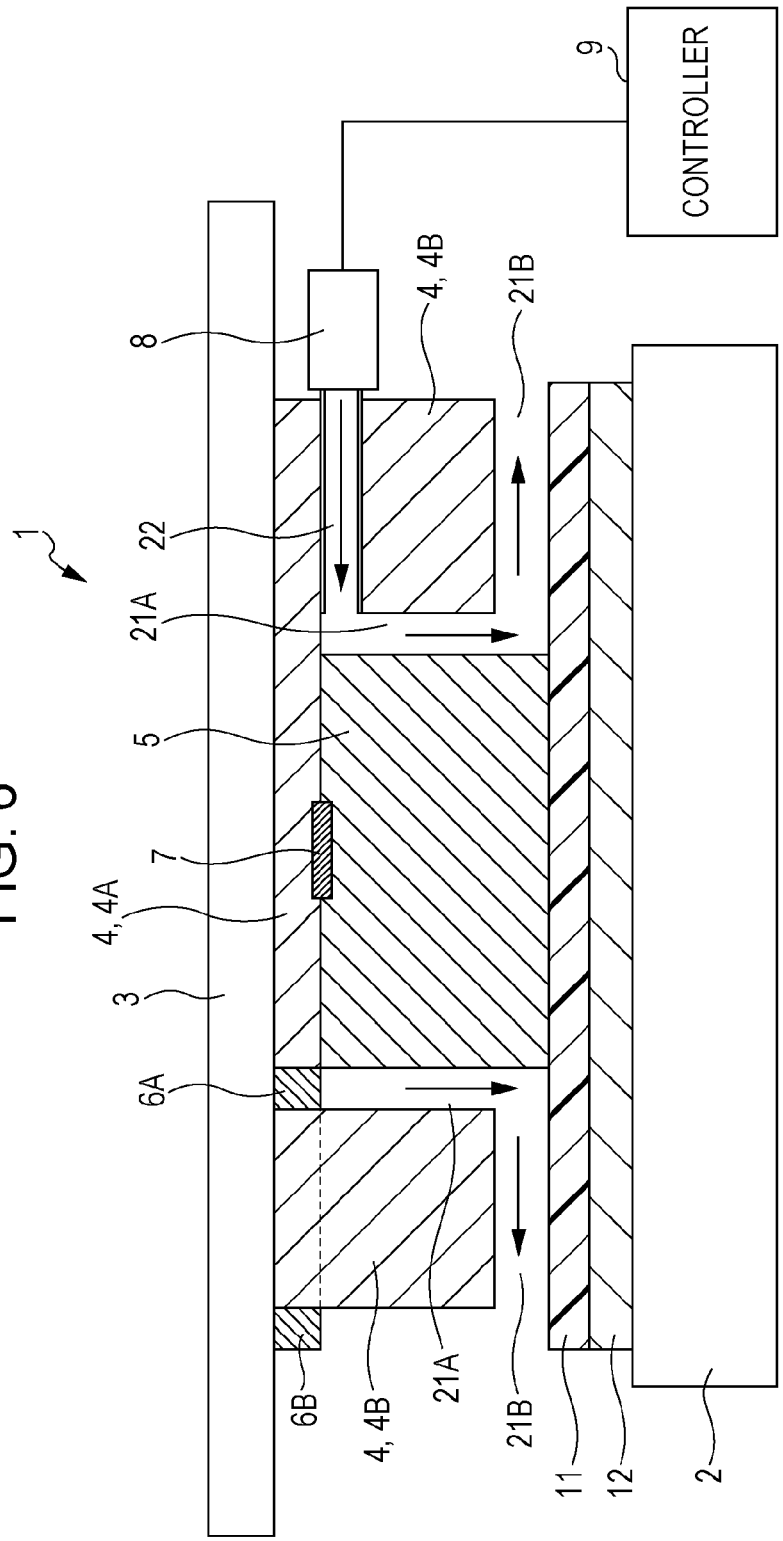
FIG. 6 is a schematic diagram depicting the imprint apparatus when air with a first pressure is supplied to a flow channel.

FIG. 6 is a schematic diagram depicting the imprint apparatus 1 when air with the first pressure is supplied to a flow channel 21A. Air with the first pressure flowing through the flow channel 21A collides with the resin 11 in the vicinity of the mold 5. The resin 11 in the vicinity of the mold 5 is the resin 11, surrounding the mold 5, that is located immediately below the flow channel 21A. Then, air with the first pressure flows through the flow channel 21B along the surface of the resin 11 and is discharged from an end of the flow channel 21B. The arrows in FIG. 6 depict a flow of air with the first pressure.

When the mold 5 makes contact with the resin 11, the resin 11 climbs the wall of the mold 5 due to capillary phenomenon. In example 1, when the controller 9 detects that the mold 5 makes contact with the resin 11, the supply unit 8 supplies air with the first pressure to the flow channel 21A and air with the first pressure flows through the flow channel 21A. Accordingly, air with the first pressure is supplied to the flow channel 21A when the mold 5 makes contact with the resin 11. Air with the first pressure supplied to the flow channel 21A flows along the wall of the mold 5 and collides with the resin 11 climbing the wall of the mold 5. When air with the first pressure collides with the resin 11 climbing the wall of the mold 5, the resin 11 is blocked from climbing the wall of the mold 5.

It is not desirable that air enters between the mold 5 and the resin 11. Accordingly, it is desirable that the first pressure of air to be supplied to the flow channel 21A has a value that blocks the resin 11 from climbing the wall of the mold 5 and blocks air from entering between the mold 5 and the resin 11.

When air with the first pressure is supplied to the flow channel 21A before the mold 5 makes contact with the resin 11 and the air with the first pressure collides with the resin 11, the surface of the resin 11 undulates. If the mold 5 is pressed against the resin 11 when the surface of the resin 11 undulates, bubbles may be caught in a concavo-convex pattern of the mold 5. In addition, if air with the first pressure is supplied to the flow channel 21A when there is a climbing section of the resin 11 on the wall of the mold 5, the climbing section of the resin 11 remains on the wall of the mold 5. Accordingly, it is desirable to supply air with the first pressure to the flow channel 21A immediately after the mold 5 makes contact with the resin 11.

Since the mold 5 is kept lowered with the mold 5 in contact with the resin 11 to press the mold 5 against the resin 11, a portion of the resin 11 in the vicinity of the mold 5 is bowed outward. Accordingly, as depicted in FIG. 3, the distance from the displacement sensor 6A to the resin 11 becomes gradually shorter than the distance from the displacement sensor 6B to the resin 11 in time T2 to T3.

If the mold 5 is kept lowered with the mold 5 in contact with the resin 11, the measurement value of the pressure sensor 7 gradually increases. As depicted in FIG. 4, the measurement value of the pressure sensor 7 gradually increases in time T2 to T3.

When a predetermined time elapses after the mold 5 makes contact with the resin 11, a pattern has been formed in the resin 11. When a pattern has been formed in the resin 11, deformation of the resin 11 caused by depression of the mold 5 stops and the measurement value of the pressure sensor 7 increases steeply. Since the measurement value of the pressure sensor 7 increases steeply, the measurement value of the pressure sensor 7 becomes equal to or more than predetermined value B. The controller 9 detects that a pattern has been formed in the resin 11 by finding the measurement value of the pressure sensor 7 to be equal to or more than predetermined value B. The controller 9 may also detect that a pattern has been formed in the resin 11 by finding that the measurement value of the pressure sensor 7 increases steeply.

When the controller 9 detects that a pattern has been formed in the resin 11, the supply unit 8 starts supplying air with the second pressure to the flow channel 21A (S105 in FIG. 2). That is, when a pattern has been formed in the resin 11, the supply unit 8 changes the pressure of air from the first pressure to the second pressure and supplies air with the second pressure to the flow channel 21A. The controller 9 controls the driving of the supply unit 8.

As depicted in FIG. 4, the supply unit 8 supplies air with the second pressure to the flow channel 21A at time T3. The second pressure, higher than the first pressure, is 0.5 MPa, for example. The second pressure may be set depending on the type, thickness, temperature conditions, and so on of the resin 11. For example, the second pressure may be set to a value equal to or more than twice the first pressure but equal to or less than 10 times.

Figure 7:
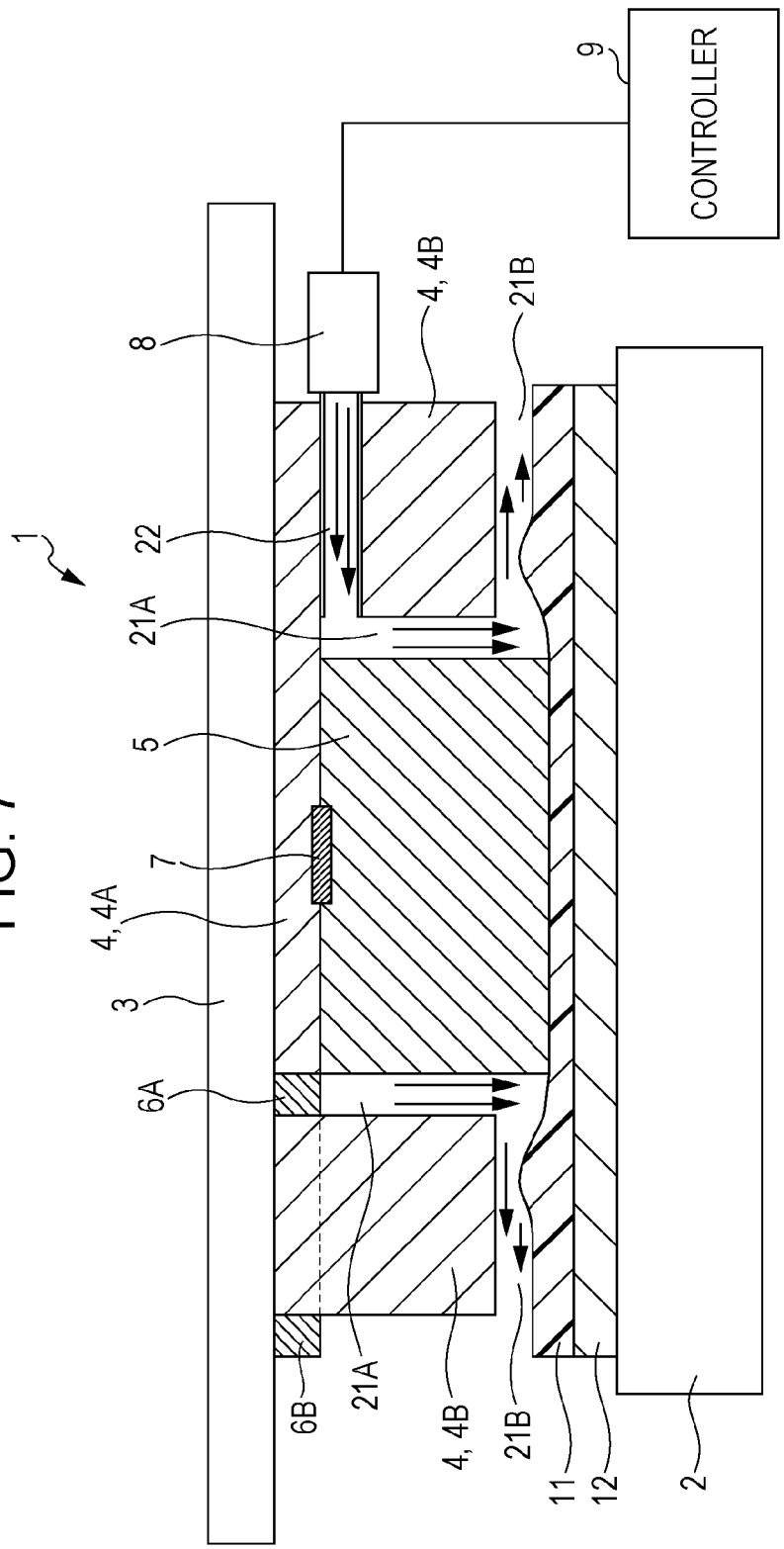
FIG. 7 is a schematic diagram depicting the imprint apparatus when air with a second pressure is supplied to the flow channel.

FIG. 7 is a schematic diagram depicting the imprint apparatus 1 when air with the second pressure is supplied to the flow channel 21A. Arrows in FIG. 7 depict flows of air with the second pressure. Pressing the mold 5 against the resin 11 forms a protrusion of the resin 11 in the vicinity of the mold 5. In example 1, when the controller 9 detects that a pattern has been formed in the resin 11, the supply unit 8 supplies air with the second pressure to the flow channel 21A. That is, when a pattern has been formed in the resin 11, the supply unit 8 supplies air with the second pressure to the flow channel 21A.

Air with the second pressure supplied to the flow channel 21 flows along the wall of the mold 5 and collides with a protrusion of the resin 11 in the vicinity of the mold 5. When the air with the second pressure collides with the protrusion of the resin 11 in the vicinity of the mold 5, the protrusion of the resin 11 moves toward the outside of the base plate 12. That is, the air with the second pressure presses the protrusion of the resin 11 toward the outside of the base plate 12.

When the protrusion of the resin 11 in the vicinity of the mold 5 moves toward the outside of the base plate 12, a portion of the resin 11 in the vicinity of the mold 5 is bowed inward. Accordingly, as depicted in FIG. 3, the distance from the displacement sensor 6A to the resin 11 becomes larger than the distance from the displacement sensor 6B to the resin 11 at time T4.

When a predetermined time elapses after the air with the second pressure is supplied to the flow channel 21A, the protrusion of the resin 11 reaches a rim of the base plate 12. Accordingly, as depicted in FIG. 3, the distance from the displacement sensor 6B to the resin 11 becomes smaller at time T5.

Figure 8:
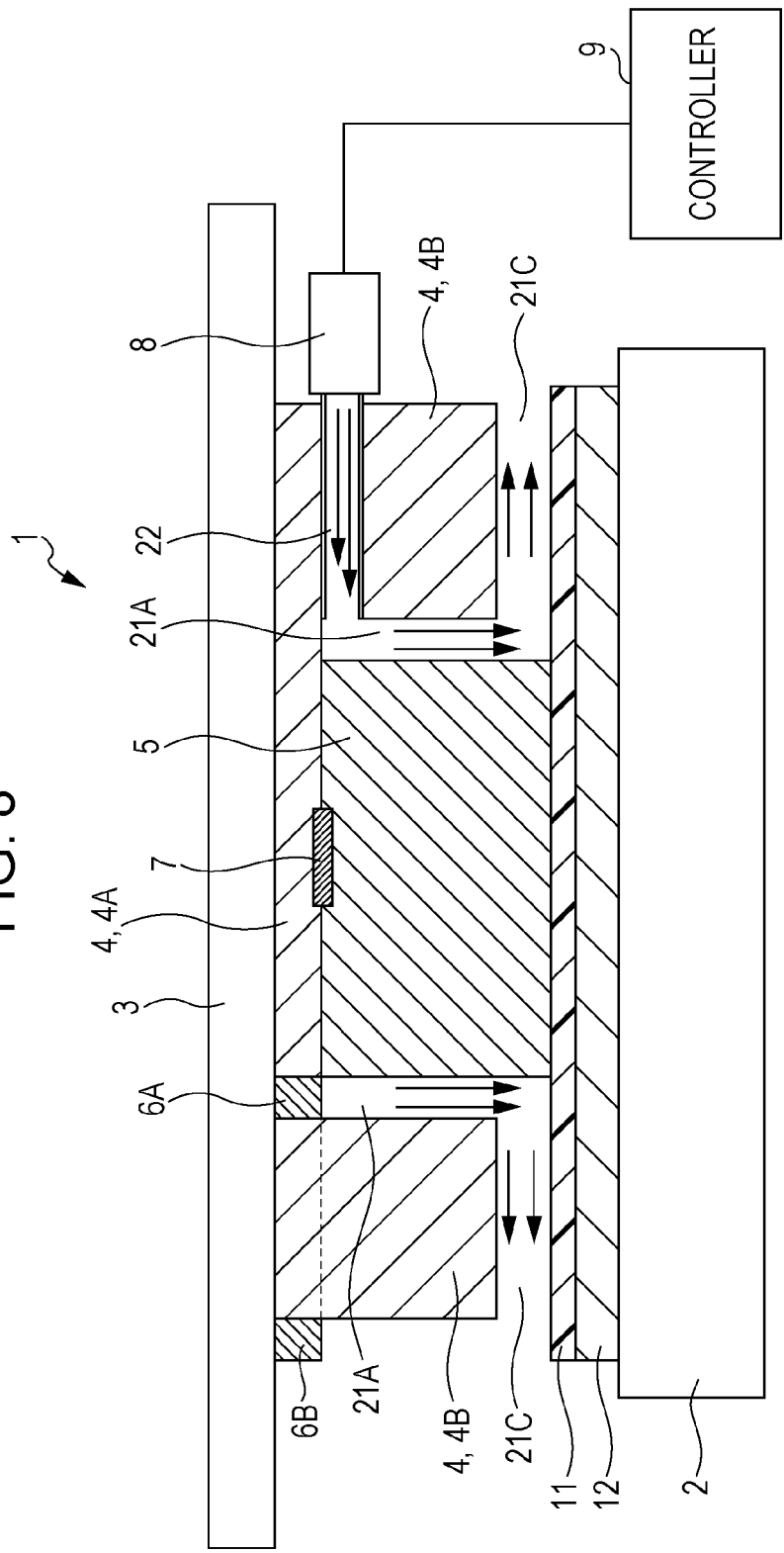
FIG. 8 is a schematic diagram depicting the imprint apparatus when a protrusion of the resin is removed.

When a predetermined time elapses after the protrusion of the resin 11 reaches the rim of the base plate 12, air flowing through the flow channel 21B causes the protrusion of the resin 11 to be discharged outside the base plate 12. When the protrusion of the resin 11 is discharged outside the base plate 12, the protrusion of the resin 11 is removed. FIG. 8 is a schematic diagram depicting the imprint apparatus 1 when the protrusion of the resin 11 is removed. Arrows in FIG. 8 depict flows of air with the second pressure.

As depicted in FIG. 8, when the protrusion of the resin 11 is removed, the resin 11 around the mold 5 is flattened. Since the resin 11 around the mold 5 is flattened, the distance from the displacement sensor 6A to the resin 11 matches the distance from the displacement sensor 6B to the resin 11 at time T6 as depicted in FIG. 3. When the distance from the displacement sensor 6A to the resin 11 is almost the same as the distance from the displacement sensor 6B to the resin 11, the distance from the displacement sensor 6A to the resin 11 may be assumed to match the distance from the displacement sensor 6B to the resin 11.

The controller 9 compares the distance from the displacement sensor 6A to the resin 11 with the distance from the displacement sensor 6B to the resin 11. The controller 9 detects that the protrusion of the resin 11 has been removed by finding the distance from the displacement sensor 6A to the resin 11 to be equal to the distance from the displacement sensor 6B to the resin 11. The controller 9 may also detect that the protrusion of the resin 11 has been removed by finding the distance from the displacement sensor 6A to the resin 11 to be almost the same as the distance from the displacement sensor 6B to the resin 11.

When the controller 9 detects that the protrusion of the resin 11 has been removed, the supply unit 8 stops supplying air to the flow channel 21A and the lift 3 stops lowering the guide 4 (S106 in FIG. 2). That is, when the protrusion of the resin 11 is removed, the supply unit 8 stops supplying air to the flow channel 21A. When the protrusion of the resin 11 has been removed, the lift 3 stops lowering the guide 4. The driving of the supply unit 8 and the lift 3 is controlled by the controller 9. Since the supplying of air to the flow channel 21A is stopped, the pressure of air becomes 0 Pa at time T6, as depicted in FIG. 4. Since the lowering of the guide 4 is stopped, the measurement value of the pressure sensor 7 becomes 0 at time T6, as depicted in FIG. 4.

After a pattern is formed in the resin 11 by the imprint apparatus 1 in example 1, the remaining film of the resin 11 is removed by anisotropic etching. Next, a pattern formed in the resin 11 is coated with metal such as copper. Next, metal such as copper is flattened by grinding to form wiring on the base plate 12. A plurality of layers of wiring may be formed on the base plate 12 by repeating a process of applying the resin 11, the process from S101 to S106 in FIG. 2, and the process of forming wiring on the based board 12.

In example 1, if the supply unit 8 supplies air with the first pressure to the flow channel 21A, the resin 11 is blocked from climbing the wall of the mold 5. Accordingly, in a flattening process after a pattern formed in the resin 11 is coated with metal such as copper, the stripping of the resin 11 is suppressed. As a result, degradation in product quality caused by damage of the pattern surface of the resin 11 is avoided. In addition, a process of stripping the removed resin 11 is not desired, thereby avoiding an increase in cost.

In example 1, if the supply unit 8 supplies air with the second pressure to the flow channel 21A, the protrusion of the resin 11 is removed. Accordingly, a process of grinding the protrusion of the resin 11 is not desired, thereby avoiding an increase in cost.

Example 2

An imprint apparatus 1 and an imprint method according to example 2 will be described. The same components as in example 1 are given the same the same reference numerals and their description are omitted. In example 2, the supply unit 8 supplies air with the first pressure to the flow channel 21A to avoid the resin 11 from climbing the wall of the mold 5 and to remove the protrusion of the resin 11.

Figure 9:
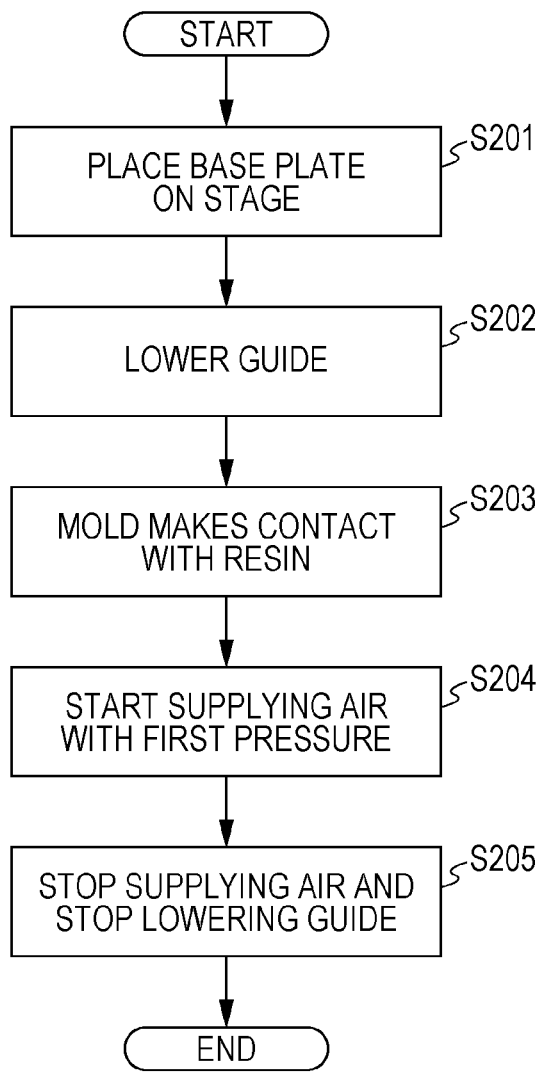
FIG. 9 depicts a processing flow of an imprint method according to example 2.
Figure 10:
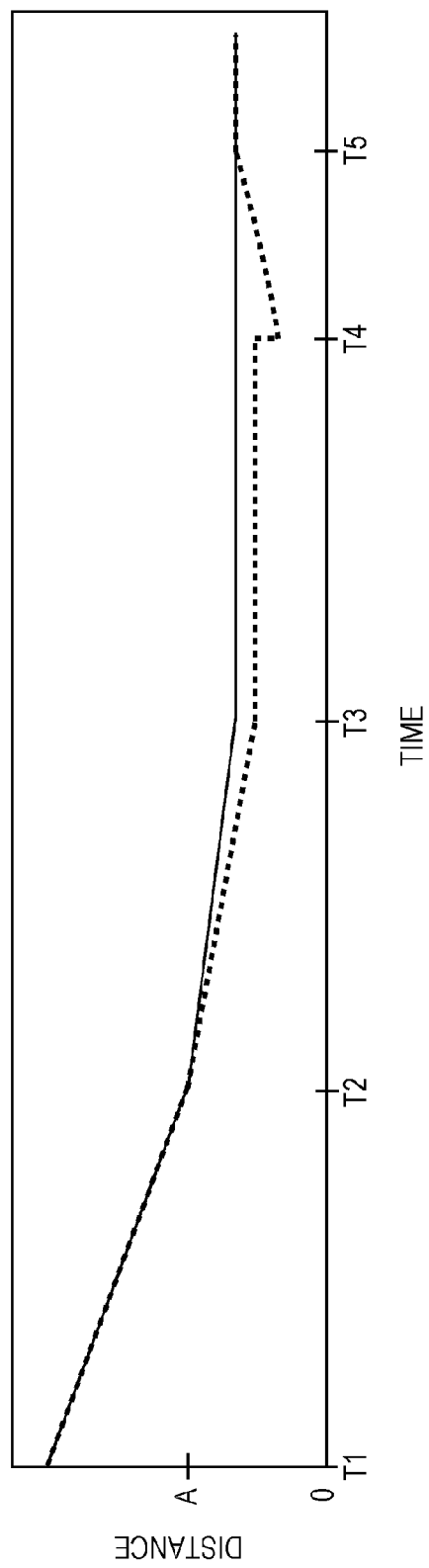
FIG. 10 is a graph depicting changes in the distance from the displacement sensor to resin and changes in the distance from the other displacement sensor to the resin.
Figure 11:
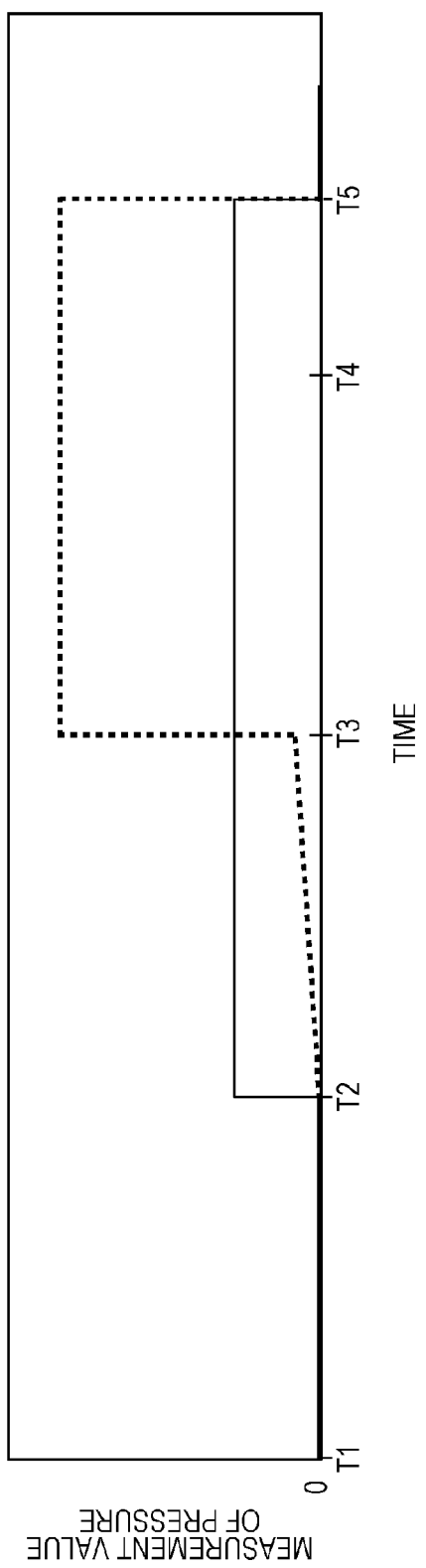
FIG. 11 is a graph depicting changes in the pressure (Pa) of air supplied by the supply unit and changes in the measurement value by the pressure sensor.
Figure 13A:
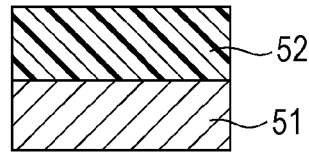
FIGS. 13A-13E depict a process of forming wiring on a base plate.
Figure 13B:
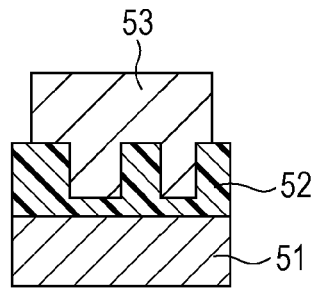
Figure 13C:
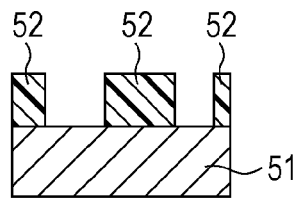
Figure 13D:
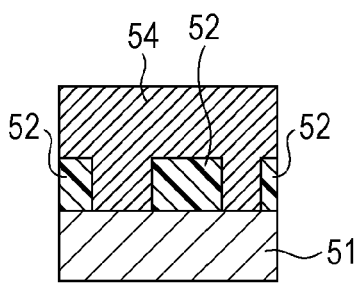
Figure 13E:
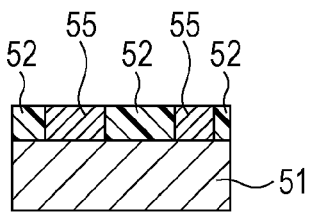
Figure 14:
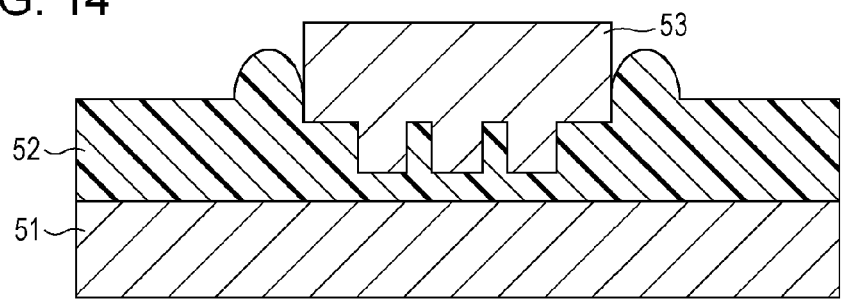
FIG. 14 depicts a protrusion of a resin formed around a mold.
Figure 15:
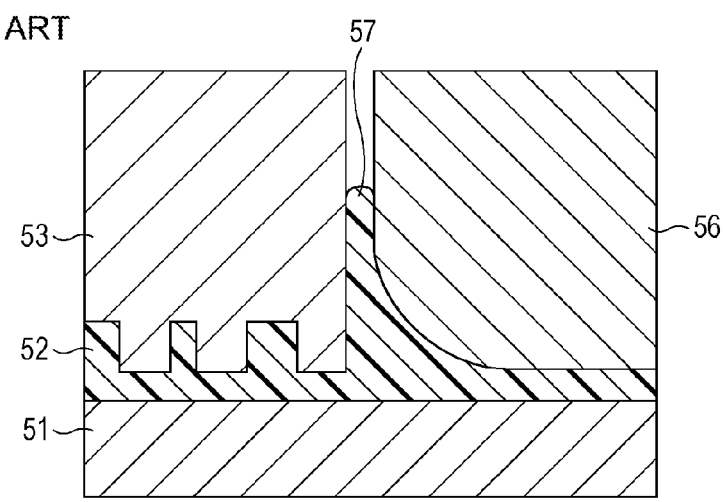
FIG. 15 depicts removal of the protrusion of the resin by scraping the resin with a squeegee.
Figure 16:
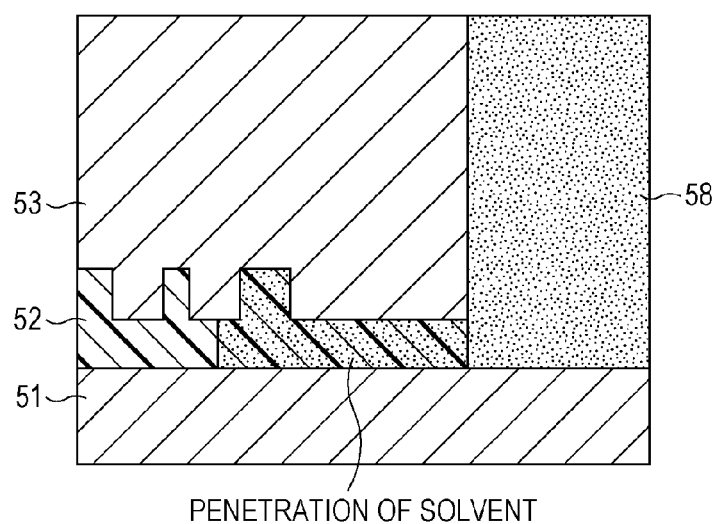
FIG. 16 depicts removal of the protrusion of the resin by dissolving the resin with a solvent.
Figure 17A:
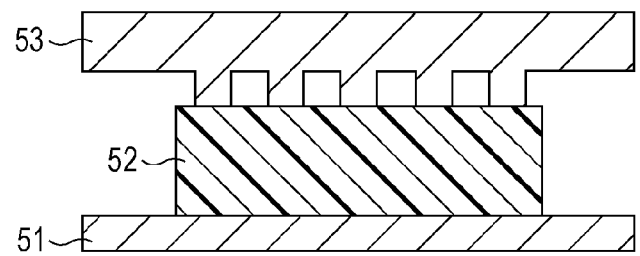
FIGS. 17A-17D depict a method of pressing the mold against the resin by using the mold larger than a base plate.
Figure 17B:
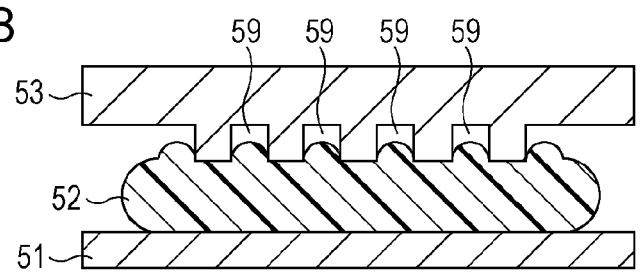
Figure 17C:
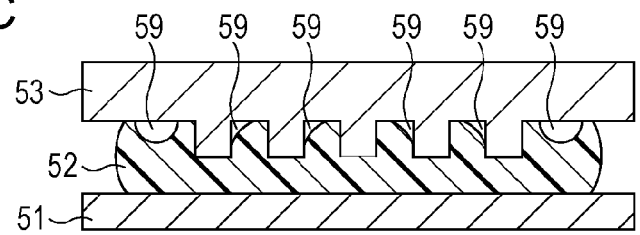
Figure 17D:
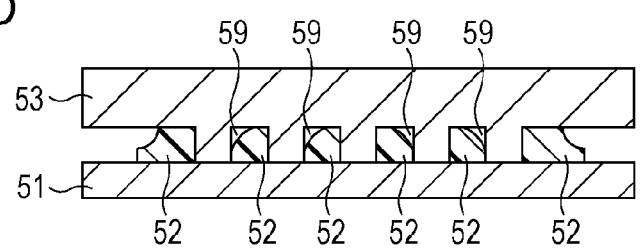

FIG. 9 depicts a processing flow of the imprint method according to example 2. FIG. 10 is a graph depicting changes in the distance from the displacement sensor 6A to the resin 11 and changes in the distance from the other displacement sensor 6B to the resin 11. In FIG. 10, changes in the distance from the displacement sensor 6A to the resin 11 are indicated by a solid line and changes in the distance from the displacement sensor 6B to the resin 11 are indicated by a dashed line. FIG. 11 is a graph depicting changes in the pressure (Pa) of air supplied by the supply unit 8 and changes in the measurement value of the pressure sensor 7. In FIG. 11, changes in the pressure of air supplied by the supply unit 8 are indicated by a solid line and changes in the measurement value of the pressure sensor 7 are indicated by a dashed line.

In the imprint method according to example 2, the base plate 12 on which the resin 11 has been put (formed) is first placed on the stage 2 and the mold 5 is placed above the base plate 12 (S201 in FIG. 9). Next, the lift 3 lowers the guide 4 at a predetermined speed (S202 in FIG. 9). The distances between the displacement sensors 6A and 6B and the resin 11 become smaller as the guide 4 lowers. Accordingly, the distance from the displacement sensor 6A to the resin 11 and the distance from the displacement sensor 6B to the resin 11 become gradually smaller in time T1 to T2 in FIG. 10. Since the supply unit 8 does not supply air yet, the pressure of air supplied by the supply unit 8 is 0 Pa in time T1 to T2 in FIG. 11.

When a predetermined time elapses after the guide 4 starts lowering, the mold 5 makes contact with the resin 11 (S203 in FIG. 9). When the mold 5 makes contact with the resin 11, the distance from the displacement sensor 6A to the resin 11 and the distance from the displacement sensor 6B to the resin 11 become predetermined distance A at time T2, as depicted in FIG. 10. The controller 9 detects that the mold 5 has made contact with the resin 11 by finding the distance from the displacement sensor 6A to the resin 11 to be equal to or less than predetermined distance A.

When the controller 9 detects that the mold 5 has made contact with the resin 11, the supply unit 8 starts supplying air with the first pressure to the flow channel 21A (S204 in FIG. 9). That is, when the mold 5 makes contact with the resin 11, the supply unit 8 supplies air with the first pressure to the flow channel 21A. The driving of the supply unit 8 is controlled by the controller 9. For example, as depicted in FIG. 11, air with the first pressure is supplied to the flow channel 21A at time T2. The first pressure may be set depending on the type, thickness, temperature conditions, and so on of the resin 11.

When the mold 5 makes contact with the resin 11, the resin 11 climbs the wall of the mold 5 due to capillary phenomenon. In example 2, when the controller 9 detects that the mold 5 makes contact with the resin 11, the supply unit 8 supplies air with the first pressure to the flow channel 21A and air with the first pressure flows through the flow channel 21A. Accordingly, air with the first pressure is supplied to the flow channel 21A when the mold 5 makes contact with the resin 11. Air with the first pressure supplied to the flow channel 21A flows along the wall of the mold 5 and collides with the resin 11 climbing the wall of the mold 5. When air with the first pressure collides with the resin 11 climbing the wall of the mold 5, the resin 11 is blocked from climbing the wall of the mold 5.

It is not desirable that air enters between the mold 5 and the resin 11. Accordingly, it is desirable that the first pressure of air to be supplied to the flow channel 21A has a value that blocks the resin 11 from climbing the wall of the mold 5 and blocks air from entering between the mold 5 and the resin 11.

Air with the first pressure supplied to the flow channel 21A flows along the wall of the mold 5 and collides with the resin 11 in the vicinity of the mold 5. When air with the first pressure collides with the resin 11 in the vicinity of the mold 5, a portion of the resin 11 in the vicinity of the mold 5 moves toward the outside of the base plate 12. That is, the portion of the resin 11 in the vicinity of the mold 5 is pressed toward the outside of the base plate 12 and a protrusion of the resin 11 is formed toward the outside of the base plate 12.

FIG. 12 is a schematic diagram depicting the imprint apparatus 1 when air with the first pressure is supplied to the flow channel 21A. As depicted in FIG. 12, when air with the first pressure collides with the resin 11 in the vicinity of the mold 5, a portion of the resin 11 is formed toward the outside of the base plate 12. Arrows in FIG. 12 depict flows of air with the first pressure. As depicted in FIG. 10, a protrusion of the resin 11 is formed toward the outside of the base plate 12 in time T2 to T3, the distance from the displacement sensor 6A to the resin 11 becomes gradually longer than the distance from the displacement sensor 6B to the resin 11.

When a predetermined time elapses after the air with the first pressure is supplied to the flow channel 21A, the protrusion of the resin 11 reaches a rim of the base plate 12. Accordingly, as depicted in FIG. 10, the protrusion of the resin 11 reaches the rim of the base plate 12 at time T4 and the distance from the displacement sensor 6B to the resin 11 becomes smaller.

When a predetermined time elapses after the protrusion of the resin 11 reaches the rim of the base plate 12, air flowing through the flow channel 21B causes the protrusion of the resin 11 to be discharged outside the base plate 12. When the protrusion of the resin 11 is discharged outside the base plate 12, the protrusion of the resin 11 is removed. When the protrusion of the resin 11 is removed, the resin 11 around the mold 5 is flattened. Since the resin 11 around the mold 5 is flattened, the distance from the displacement sensor 6A to the resin 11 matches the distance from the displacement sensor 6B to the resin 11 at time T5 as depicted in FIG. 10. When the distance from the displacement sensor 6A to the resin 11 is almost the same as the distance from the displacement sensor 6B to the resin 11, the distance from the displacement sensor 6A to the resin 11 may be assumed to match the distance from the displacement sensor 6B to the resin 11.

The controller 9 compares the distance from the displacement sensor 6A to the resin 11 with the distance from the displacement sensor 6B to the resin 11. The controller 9 detects that the protrusion of the resin 11 has been removed by finding the distance from the displacement sensor 6A to the resin 11 to be equal to the distance from the displacement sensor 6B to the resin 11. The controller 9 may also detect that the protrusion of the resin 11 has been removed by finding the distance from the displacement sensor 6A to the resin 11 to be almost the same as the distance from the displacement sensor 6B to the resin 11.

When the controller 9 detects that the protrusion of the resin 11 has been removed, the supply unit 8 stops supplying air to the flow channel 21A and the lift 3 stops lowering the guide 4 (S205 in FIG. 9). That is, when the protrusion of the resin 11 is removed, the supply unit 8 stops supplying air to the flow channel 21A. When the protrusion of the resin 11 has been removed, the lift 3 stops lowering the guide 4. The driving of the supply unit 8 and the lift 3 is controlled by the controller 9. Since the supplying of air to the flow channel 21A is stopped, the pressure of air becomes 0 Pa at time T5, as depicted in FIG. 11. Since the lowering of the guide 4 is stopped, the measurement value of the pressure sensor 7 becomes 0 at time T5, as depicted in FIG. 11.

After a pattern is formed in the resin 11 by the imprint apparatus 1 in example 2, the remaining film of the resin 11 is removed by anisotropic etching. Next, a pattern formed in the resin 11 is coated with metal such as copper. Next, metal such as copper is flattened by grinding to form wiring on the base plate 12. A plurality of layers of wiring may be formed on the base plate 12 by repeating a process of applying the resin 11, the process from S201 to S205 in FIG. 9, and the process of forming wiring on the based board 12.

In example 2, if the supply unit 8 supplies air with the first pressure to the flow channel 21A, the resin 11 is blocked from climbing the wall of the mold 5 and the protrusion of the resin 11 is removed. Accordingly, in a flattening process after a pattern formed in the resin 11 is coated with metal such as copper, the stripping of the resin 11 is suppressed. As a result, degradation in product quality caused by damage of the pattern surface of the resin 11 is avoided. In addition, a process of removing the stripped resin 11 is not desired, thereby avoiding an increase in cost. In addition, a process of grinding the protrusion of the resin 11 is not desired, thereby avoiding an increase in cost.

Examples 1 and 2 depict examples in which the lift 3 lowers the guide 4 and presses the mold 5 against the resin 11 to from patters in the resin 11. The present embodiment is not limited to the forming examples indicated by examples 1 and 2. For example, a pattern may be formed in the resin 11 by causing the stage 2 to go up, raising the base plate 12, and pressing the mold 5 against the resin 11. The stage 2 may be raised or lowered by a lift disposed under the stage 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An imprint apparatus comprising:
   a mold that forms a pattern in a resin on a base plate;
   a press unit that presses the mold against the resin;
   a flow channel that is formed by a wall of the mold and a surface of the resin, air flowing along the wall and the surface; and
   a supply unit that supplies air to the flow channel;
   wherein the supply unit supplies air with a first pressure to the flow channel when the mold makes an initial contact with the resin.

2. The imprint apparatus according to claim 1,
   wherein the supply unit supplies air with a second pressure higher than the first pressure to the flow channel when the pattern has been formed in the resin.

3. The imprint apparatus according to claim 1,
   wherein the supply unit stops supplying the air to the flow channel when a protrusion formed by pressing the mold against the resin is removed.

4. An imprint method comprising:
   pressing a mold that forms a pattern in a resin on a base plate against the resin; and
   supplying air with a first pressure to a flow channel formed by a wall of the mold and a surface of the resin when the mold makes an initial contact with the resin, air flowing along the wall and the surface.

5. The imprint method according to claim 4, further comprising:
   supplying air with a second pressure higher than the first pressure to the flow channel when the pattern has been formed in the resin.

6. The imprint method according to claim 4, further comprising:
   stopping supplying the air to the flow channel when a protrusion formed by pressing the mold against the resin is removed.

\* \* \* \* \*